US011803684B1

(12) United States Patent
Fales et al.

(10) Patent No.: US 11,803,684 B1
(45) Date of Patent: Oct. 31, 2023

(54) RELATIVE PLACEMENT BY APPLICATION OF LAYERED ABSTRACTIONS

(71) Applicant: Cadence Design Systems, Inc., San Jose, CA (US)

(72) Inventors: Jonathan R. Fales, Finksburg, MD (US); Joshua David Tygert, Seneca, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 170 days.

(21) Appl. No.: 17/493,550

(22) Filed: Oct. 4, 2021

(51) Int. Cl.
*G06F 30/00* (2020.01)
*G06F 30/392* (2020.01)
*G06F 30/3947* (2020.01)
*G06F 30/39* (2020.01)
*H04L 41/0897* (2022.01)
*G06T 3/40* (2006.01)

(52) U.S. Cl.
CPC ........... *G06F 30/392* (2020.01); *G06F 30/39* (2020.01); *G06F 30/3947* (2020.01); *H04L 41/0897* (2022.05); *G06T 3/40* (2013.01)

(58) Field of Classification Search
CPC .... G06F 30/392; G06F 30/39; G06F 30/3947; H04L 41/0897; G06T 3/40
See application file for complete search history.

(56) References Cited

U.S. PATENT DOCUMENTS

| 5,640,497 | A | * | 6/1997 | Woolbright | G06T 11/60 716/55 |
| 6,536,018 | B1 | * | 3/2003 | Chisholm | G06F 30/30 716/136 |
| 6,539,528 | B2 | * | 3/2003 | Hwang | G06F 30/39 716/139 |
| 8,286,111 | B2 | * | 10/2012 | Chandra | G01K 7/425 716/110 |
| 9,262,571 | B2 | * | 2/2016 | Tuan | G06F 30/398 |
| 9,594,864 | B2 | * | 3/2017 | Song | G06F 30/39 |
| 9,985,014 | B2 | * | 5/2018 | Xu | H01L 27/0207 |
| 10,318,693 | B1 | * | 6/2019 | Viswanathan | G06F 30/392 |
| 11,403,448 | B1 | * | 8/2022 | Yu | G06F 30/327 |

(Continued)

FOREIGN PATENT DOCUMENTS

| CN | 112149376 A | * | 12/2020 | .......... G06F 30/392 |
| TW | 202213157 A | * | 4/2022 | ............ G06F 30/33 |

*Primary Examiner* — Naum Levin
(74) *Attorney, Agent, or Firm* — Schwegman Lundberg & Woessner, P.A.

(57) ABSTRACT

Various embodiments described herein provide for a method and system for relative placement of components for a circuit layout by retrieving a data structure of a first circuit design, the data structure including a location of each component, determining a component characteristic for each component, and selecting a first group of two or more components having a shared component characteristic. Additionally, the method and system can instantiate a second circuit design and retrieve the data structure after the second circuit design is instantiated. The method and system include, for the second circuit design, calculating a first scaling factor and scaling each of the components of the first group from the first circuit design and placing the first group at a location in the second circuit design corresponding to location of the first group within the first circuit design.

20 Claims, 9 Drawing Sheets

(56) References Cited

U.S. PATENT DOCUMENTS

| | | | | |
|---|---|---|---|---|
| 2011/0161907 A1* | 6/2011 | Cheng | ................... | G06F 30/398 |
| | | | | 716/139 |
| 2012/0210286 A1* | 8/2012 | Abdelhamid | ......... | G06F 30/327 |
| | | | | 716/113 |
| 2012/0304139 A1* | 11/2012 | Chen | ..................... | G06F 30/392 |
| | | | | 716/111 |
| 2013/0019219 A1* | 1/2013 | Chen | ....................... | G06F 30/39 |
| | | | | 716/111 |
| 2022/0197129 A1* | 6/2022 | Chen | ................ | H01L 31/02325 |

* cited by examiner

RELATIVE PLACEMENT BY APPLICATION OF LAYERED ABSTRACTIONS

TECHNICAL FIELD

Embodiments of the present disclosure relate to techniques for applying relative placement of components using layered abstractions.

BACKGROUND

Relative component placement is a widely used method for creating a new geometric arrangement of new components using a reference geometric arrangement of reference components where there is a known or definable correlation between reference components and new components. Relative component placement is a method of positioning some or all of the new components within a new arrangement based on the relative geometric relationship of corresponding components in the reference arrangement.

A new component's position in the new arrangement is determined by its corresponding component's geometric relationships from the reference arrangement. Relative component placement may be applied hierarchically. When a characteristic of a reference component differs from a characteristic of its corresponding new component, conventional methods of relative component placement struggle to produce a viable new arrangement.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
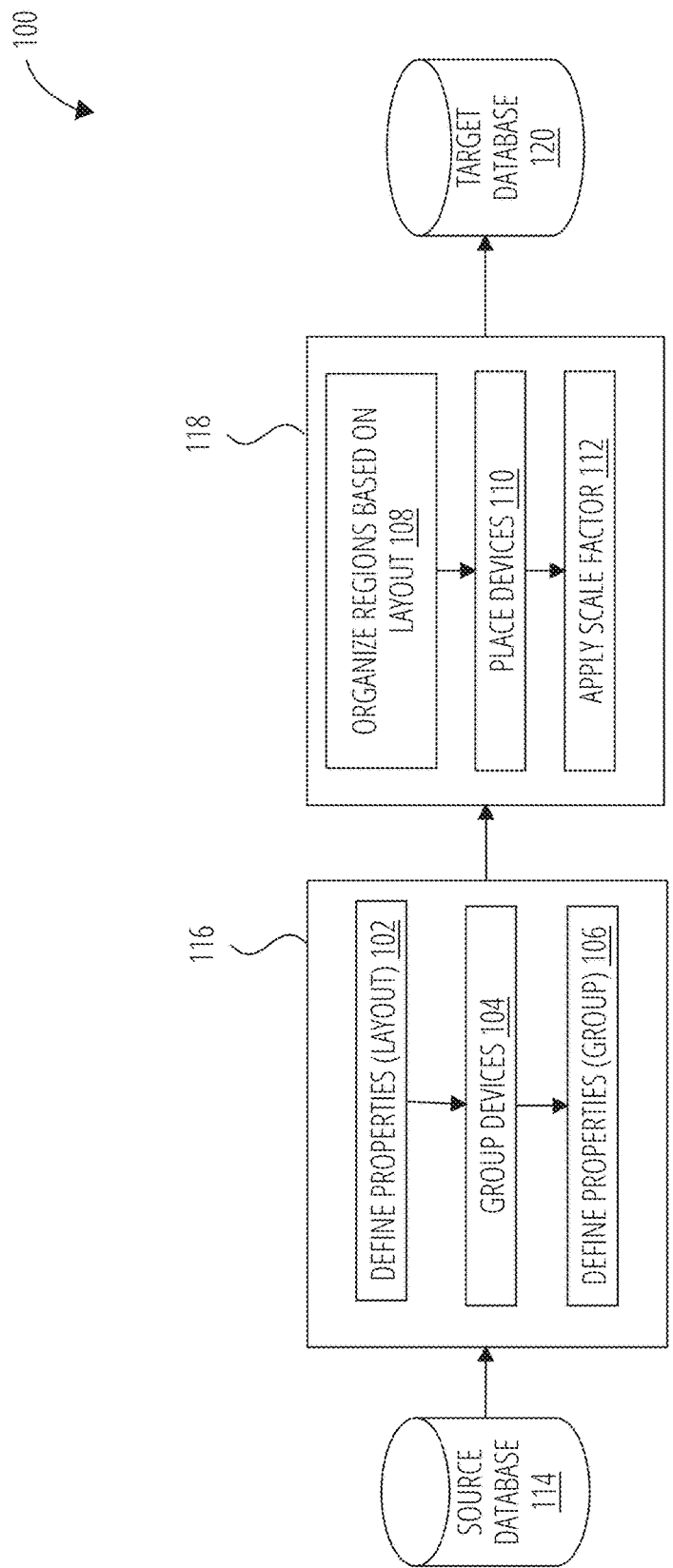
FIG. 1 illustrates a block diagram for relative placement of components in accordance with some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Typical updates and improvements made to circuit layouts stem from previous iterations of developed and placed layouts. Using the older or previously used layout to generate a new version saves cost in time and resources. Relative component placement is typically used for generating new layouts. However, technical challenges exist when updating layouts from a first technology (e.g., 10 nm) to a second technology (e.g., 7 nm) as the proportions, spacings, and placement of the components do not transfer from the first to second technology.

Traditional techniques fail to address the complexities of relative placement due to, among other things, competing priorities of the task. When transforming a placement into a new technology, the components can change in their classification and/or their relationships can change based on the change in type. As conventional techniques assume similar relationships for equivalent instances, relative placement of components into a new technology become cumbersome and necessitate manual intervention and updating.

Contrary to traditional approaches, the technical solution contemplated herein abstracts various properties of components and re-applies the components in a layered, or hierarchical approach. By abstracting the placement relationships between components as well as abstracting the properties of the components, relative placement of such components can be used to update new technologies while offering the flexibility to apply new conditions to the layout.

A technical solution contemplated herein provides an overall process including a first step of scanning, classifying, and abstracting an existing layout using a flexible, automatic, ordered, and extensible geometric introspection. A scan line engine can be used to determine properties of components within the existing layout. Based on the scanned layout, grouping design objects into similar classes and recording, for each group, a group abstracted property set (hereafter referred to as the global grid). The process includes a second step of generating and re-applying relative placement on a new layout including automatic, ordered, extensible geometric introspection to reclassify design objects (e.g., components). Each class of design objects is processed, and a group abstracted property set (hereafter referred to as the local grid) is applied. Subsequently, a layout abstracted property set is applied to the layout (including all of the classes of design objects). Additionally, a third step can include performing layout compaction and various other placement optimizations as needed. In other words, the technical solution contemplated herein utilizes an existing layout (also referred to herein as a first circuit design) to leverage the component placement of components in the existing layout and mapping them to a new layout (also referred to herein as a second circuit design). The existing layout includes a global grid marking the locations of each component. Each component from the existing layout is placed in the new layout while maintaining relative placements with respect to each component (or group of components) in accordance with its global grid coordinates. Additional challenges exist in maintaining relationships between components of a specified type when transferred from the existing layout to the new layout.

To address these challenges, the relative placement is abstracted into layers. A first layer of abstraction includes determining a location for each of the components and assigning the location as its location within a global grid. A second layer of abstraction includes identifying one or more common component characteristics and grouping the components based on the common characteristic within a local grid.

The global grid maintains a placement of the component within the layout generally, while the local grid maintains a relationship between one or more component in a group sharing a common characteristic. The grouped components are used to maintain such relationships.

Consistent with some embodiments, a method may include defining a global grid of a first circuit design stored in memory, the global grid including a location of each component of a plurality of components within the first circuit design, determining, for each component of the first circuit design, a location within the global grid and a component characteristic. The method further includes selecting, for a first group, two or more components of the plurality of components that have a shared components characteristic and a first global location. The method further includes instantiating a second circuit design including at least a subset of components of the plurality of components of the first circuit design, defining a second global grid for the second circuit design, receiving a first scaling factor for the second circuit design, and scaling the first group based on the first scaling factor for the components of the first group. The method further includes placing the first group at a location in the second circuit design corresponding to the first global location of the first group in the global grid of the first circuit design.

The various operations of example methods described herein may be performed, at least partially, by one or more processors that are temporarily configured (e.g., by software) or permanently configured to perform the relevant operations. Similarly, the methods described herein may be at least partially processor implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

FIG. 1 illustrates a block diagram for relative placement of components in accordance with some embodiments. System 100 includes a source database 114 including one or more layout designs, a first block 116, a second block 118, and a target database 120.

Source database 114 can include various layouts including previously designed circuit layouts having one or more components. In some embodiments, the source database 114 includes various circuit layouts for different technologies.

First block 116 includes operations defining a first set of operations to be applied on a layout obtained from a database (e.g., source database 114). A first step includes defining properties of each of the one or more devices (also referred to herein as components) within the layout (operation 102). A second step includes grouping devices based on similar or same characteristics (operation 104) and further defining the properties of each grouped device (operation 106). In some embodiments, a flexible scanline engine is configured to scan, classify, and define properties of an existing layout. The flexible scanline engine can be configured based on selected parameters including scan tolerance, scan filter, and an accumulation factor. The flexible scanline engine can also scan multiple layers of a layout to identify, classify, and define properties of each component on each layer within the layout.

Second block 118 includes operations defining a second set of operations to be applied on a layout obtained from a database (e.g., source database 114). In some embodiments, the second set of operations is applied on a new instance of a layout (e.g., a copy of the layout) in a new or undeveloped technology. A first operation of the second block 118 includes organizing regions based on the layout (e.g., organizing the new layout instance based on the regions of the previous layout, operation 108). A second operation of the second block 118 includes placing devices (e.g., components) within the new instance of the layout (operation 110), and where applicable, applying one or more scaling factors (operation 112). The output of second block 118 is an update, or new layout instance that may be stored in a target database 120.

Figure 2:
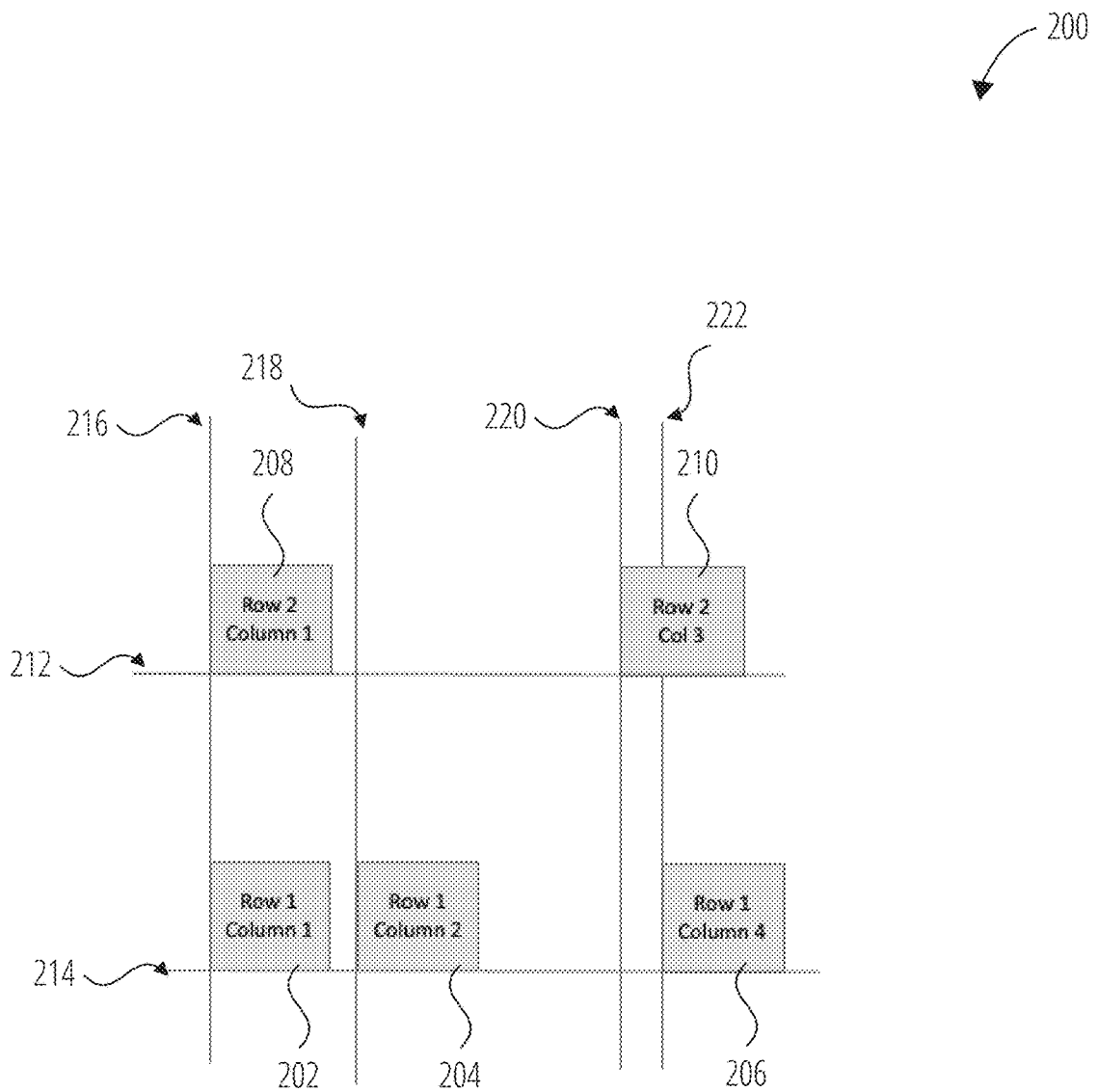
FIG. 2 illustrates a diagram of an example global grid of a relative placement of components in accordance with some embodiments.

FIG. 2 illustrates an example global grid of a relative placement of components in accordance with some embodiments. Example layout 200 includes a plurality of components 202, 204, 206, 208, and 210 within a global grid delineated by an x-axis and a y-axis. In some embodiments, a scanline engine scans each component within a layout to determine a location of each component. The locations of each component are marked within a global grid. X-axis gridlines 212 and 214 and y-axis gridlines 216, 218, 220, and 222 show an example segment of a layout defined by the global grid. Other various components that are not shown may exist within the layout.

As shown in FIG. 2, each of the components is assigned a coordinate based on a position of the component within the global grid. Component 202 has a coordinate (row 1, column 1) and may be otherwise expressed as x-axis gridline 214, y-axis gridline 216. Corresponding coordinates are assigned to each component within the layout. The global grid refers to an organization of each component within the layout and each component has a location with the global grid. The global grid is different from a local grid, which is discussed in greater detail with respect to FIGS. 3-4.

Figure 3:
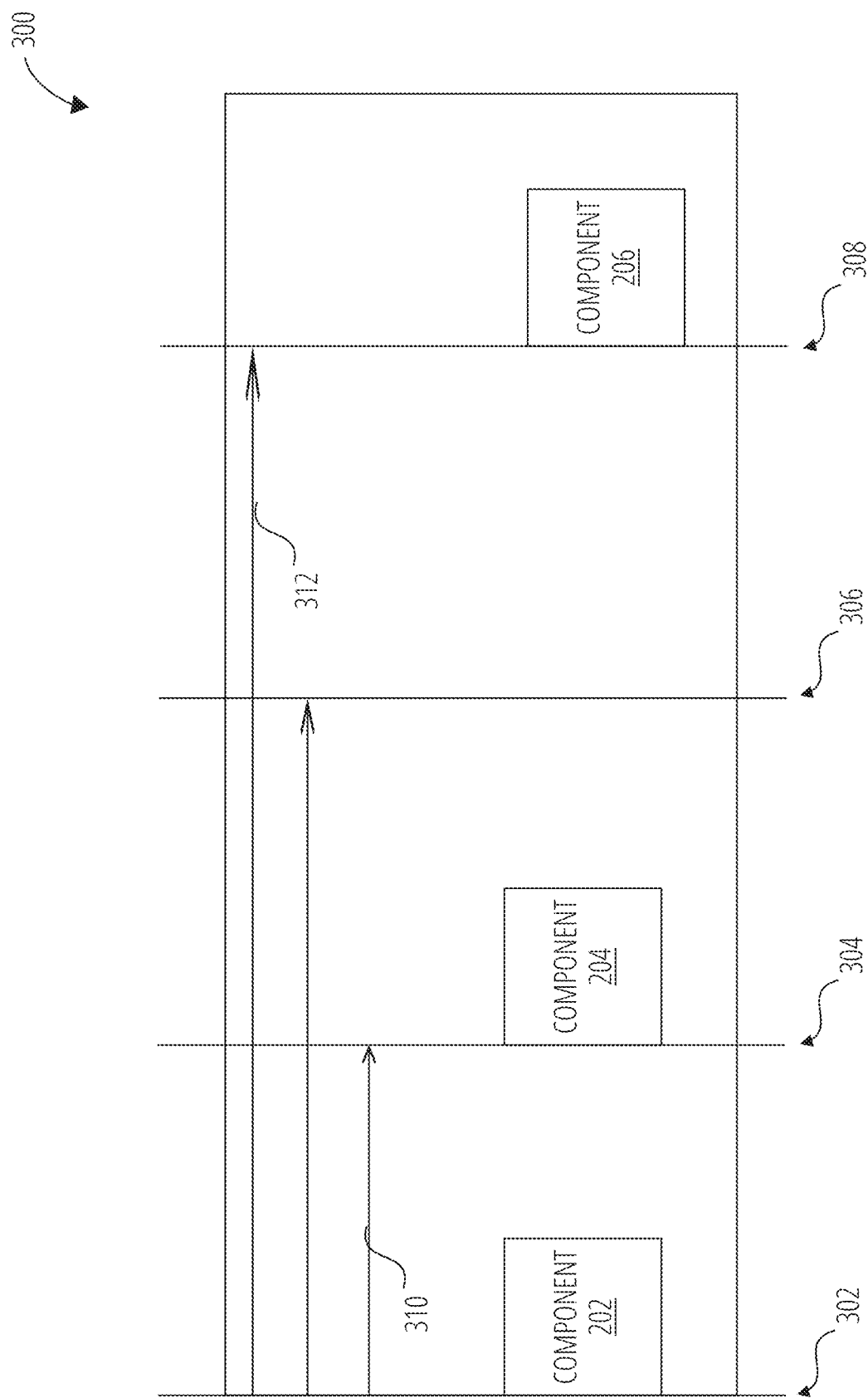
FIG. 3 illustrates a diagram of an example local grid of a relative placement of components in accordance with some embodiments.

FIG. 3 illustrates an example local grid of a relative placement of components in accordance with some embodiments. Example layout 300 is a view of a first grouping of components in accordance with some embodiments. Example layout 300 in some embodiments, is a sub-section of a larger layout (e.g., layout 200. As shown in FIG. 3, example layout 300 is a view of components 202, 204, and 206 of layout 200. Components 202, 204, and 206 may have a shared component characteristic. For example, components 202, 204, and 206 share a component characteristic of a same or similar: gate pitch, design objective, component type, width, layer count, or component size. There may be various other component characteristics used to define groups of components. Additionally, the grouping of components may be based on one or more of shared component characteristics.

Example layout 300 includes a local grid including multiple pitch lines 302, 304, 306, and 308 (e.g., grid lines). The local grid is defined to encompass each component of the defined group of components. The pitch lines delineate a grid spacing between grouped components (e.g., first grouping of components). In some embodiments, a leftmost component of the group of components is the "origin" or "reference" that will be used as an anchor. For example, component 202 is the anchor and component 204 is described as being 1 pitch from component 202, and component 206 is 3 pitches from component 202.

The pitch lines are spaced out based on the shared component characteristics or by input definition (e.g., user defined) and as such, the pitch lines (or delineation) may differ from a first grouping to a second grouping. For example, a first group includes 3 components. A second group includes 5 components. The first group is delineated by pitch lines that are 20 mm apart and the second group is delineated by pitch lines that are 35 mm apart. The distances between components 202, 204, and 206 can be measured by an integer value represented by a number of pitch lines between the components. Distance 310 indicates the distance between component 202 and 204 is one pitch line, distance 312 indicates the distance between component 202 and 206 is 3 pitch lines. The number of pitches between components can be used to scale the group of components when needed (e.g., in a new layout with different dimensions).

It is understood that there may be other components within the group that are not shown for clarity. Additionally, in some embodiments, any component can be considered the origin (e.g., component 202 or component 204).

Figure 4:
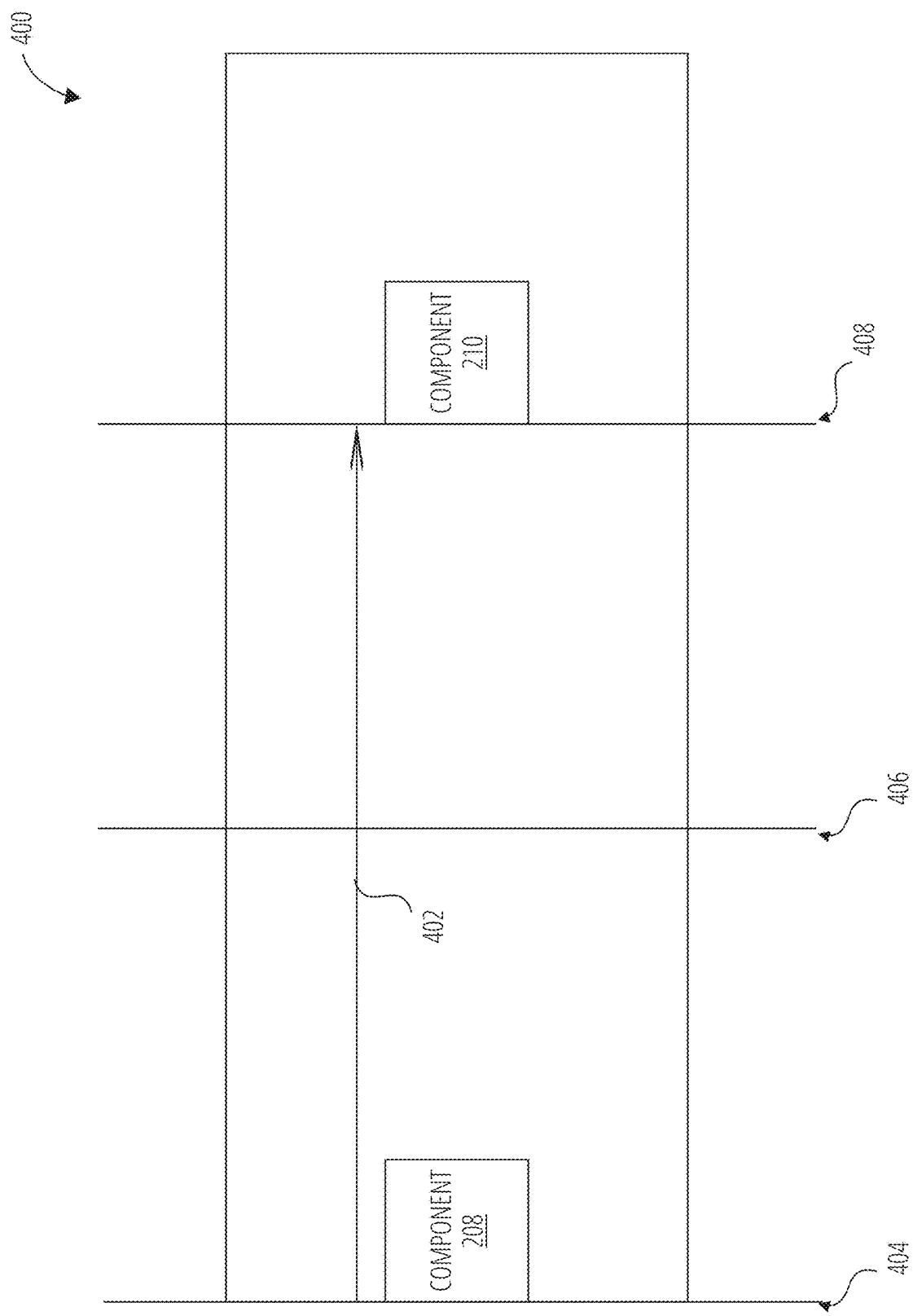
FIG. 4 illustrates a diagram of a second example of a local grid for relative placement of components in accordance with some embodiments.

FIG. 4 illustrates a second example of a local grid for relative placement of components in accordance with some embodiments. Example layout 400 is a view of a second grouping of components 208 and component 210. Example layout 400 is similar to example layout 300 as they both include components grouped together defined by common (or shared) component characteristics. Example layout 400 includes two components 208 and 210 within a second group layout. As compared to example layout 300, example layout 400 has a larger distance between pitch lines 404, 406, and 408. For example, if example layout 300 is delineated by pitch lines that are 35 mm apart, example layout 400 is delineated by pitch lines that are 50 mm apart. Components 208 and 210 are separated by distance 402, a distance of 2 pitches.

Figure 7:
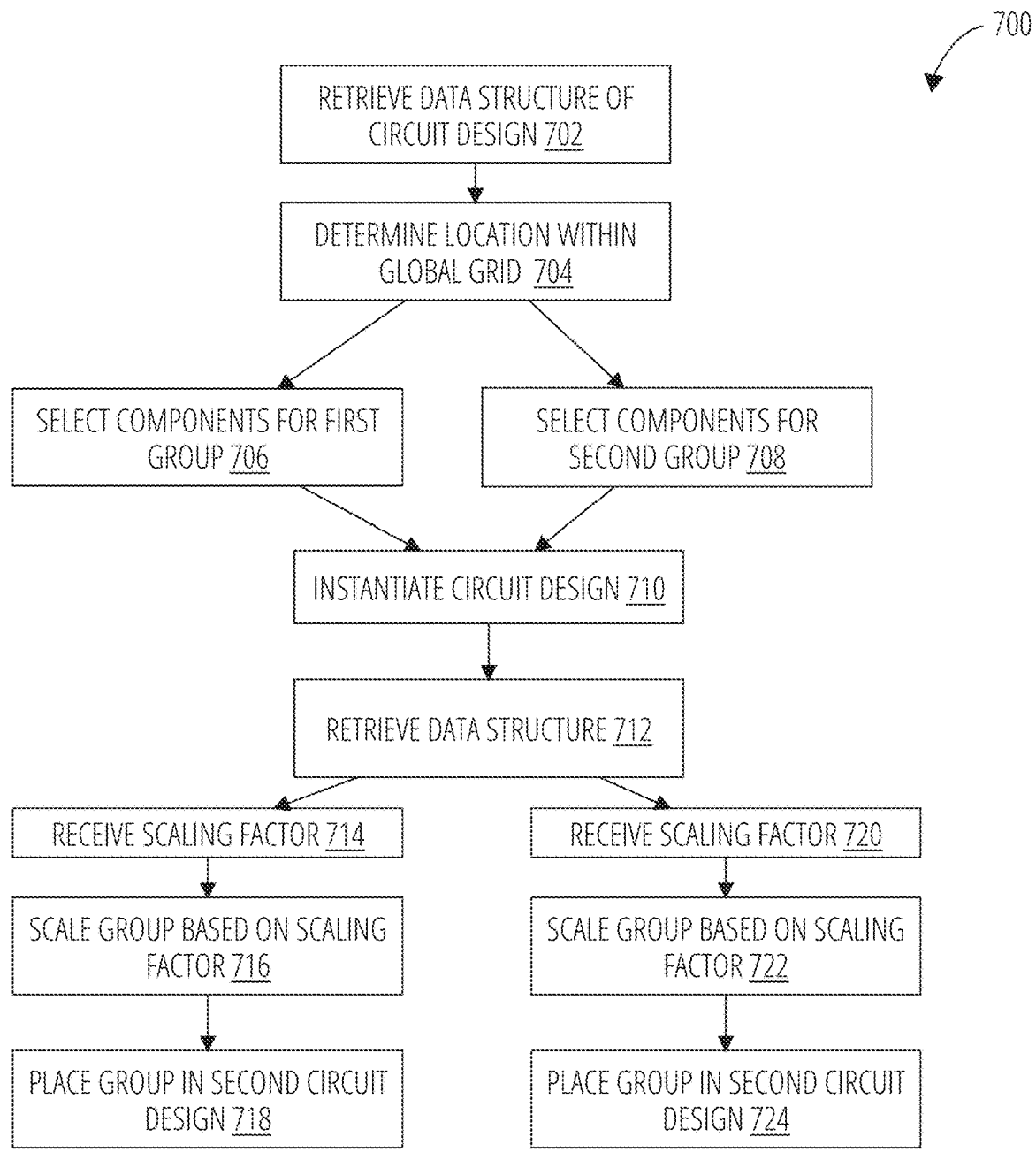
FIG. 7 illustrates a flow chart of an example method for performing operations of relative placement of components in accordance with some embodiments.

As described in greater detail with respect to FIG. 7, each of the groups may have varying local grids delineated by varying pitches. Each of the groups may have a specific scaling factor to be applied on the group when instantiated in a new circuit layout.

Figure 5:
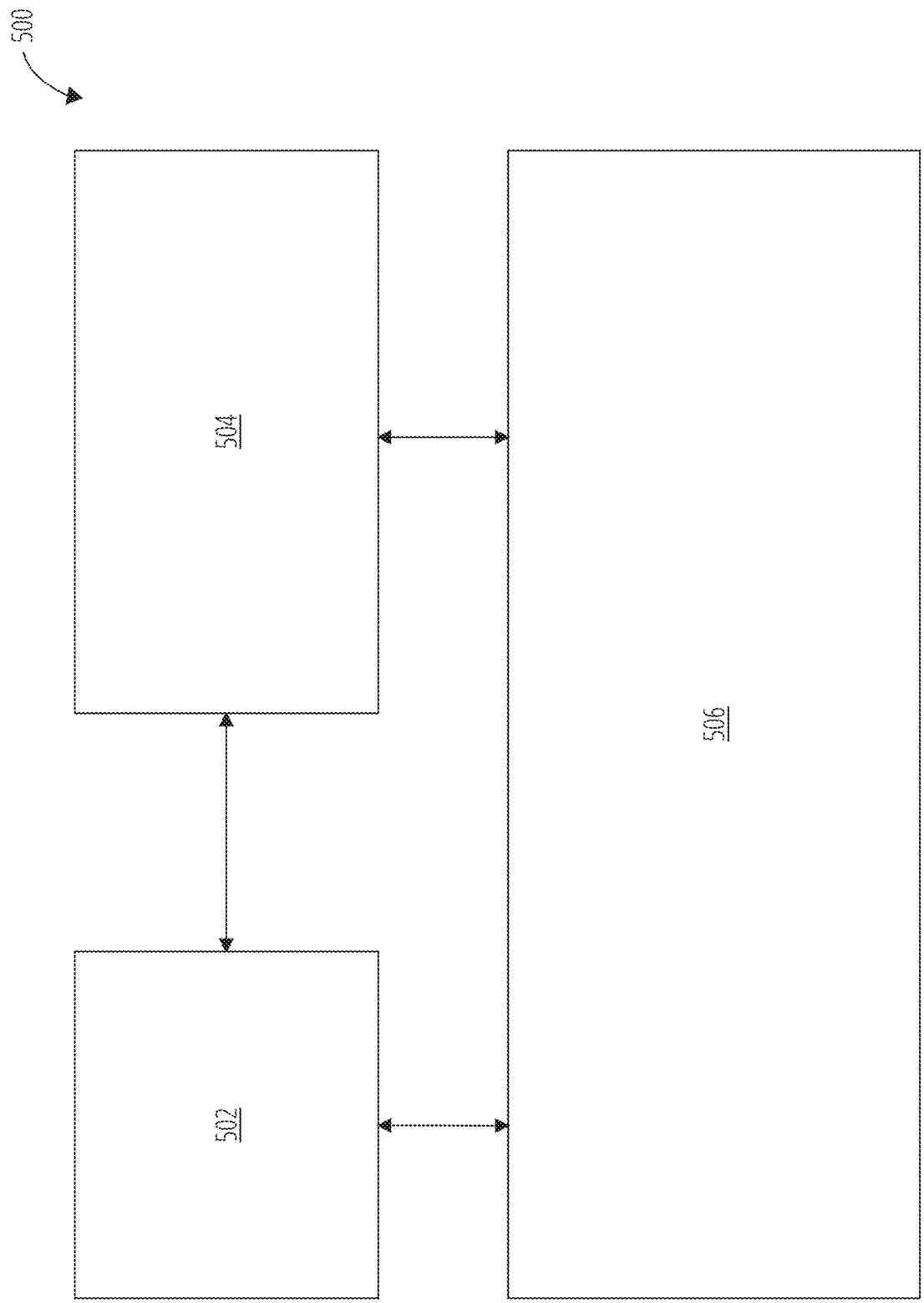
FIG. 5 illustrates an example circuit diagram including a global grid for relative placement of components in accordance with some embodiments.

FIG. 5 illustrates an example circuit diagram including a global grid for relative placement of components in accordance with some embodiments. Example layout 500 includes grouped blocks 502, 504, and 506. Each of the grouped blocks have locational relationships to the other blocks. In other words, block 502 is related to block 504 and to 506, block 504 is related to block 502 and 506, and block 506 is related to block 502 and 504. The positions of each of blocks 502, 504, and 506 relative to each other have been obtained by the component locations defined by the global grid (e.g., FIG. 2).

Figure 6:
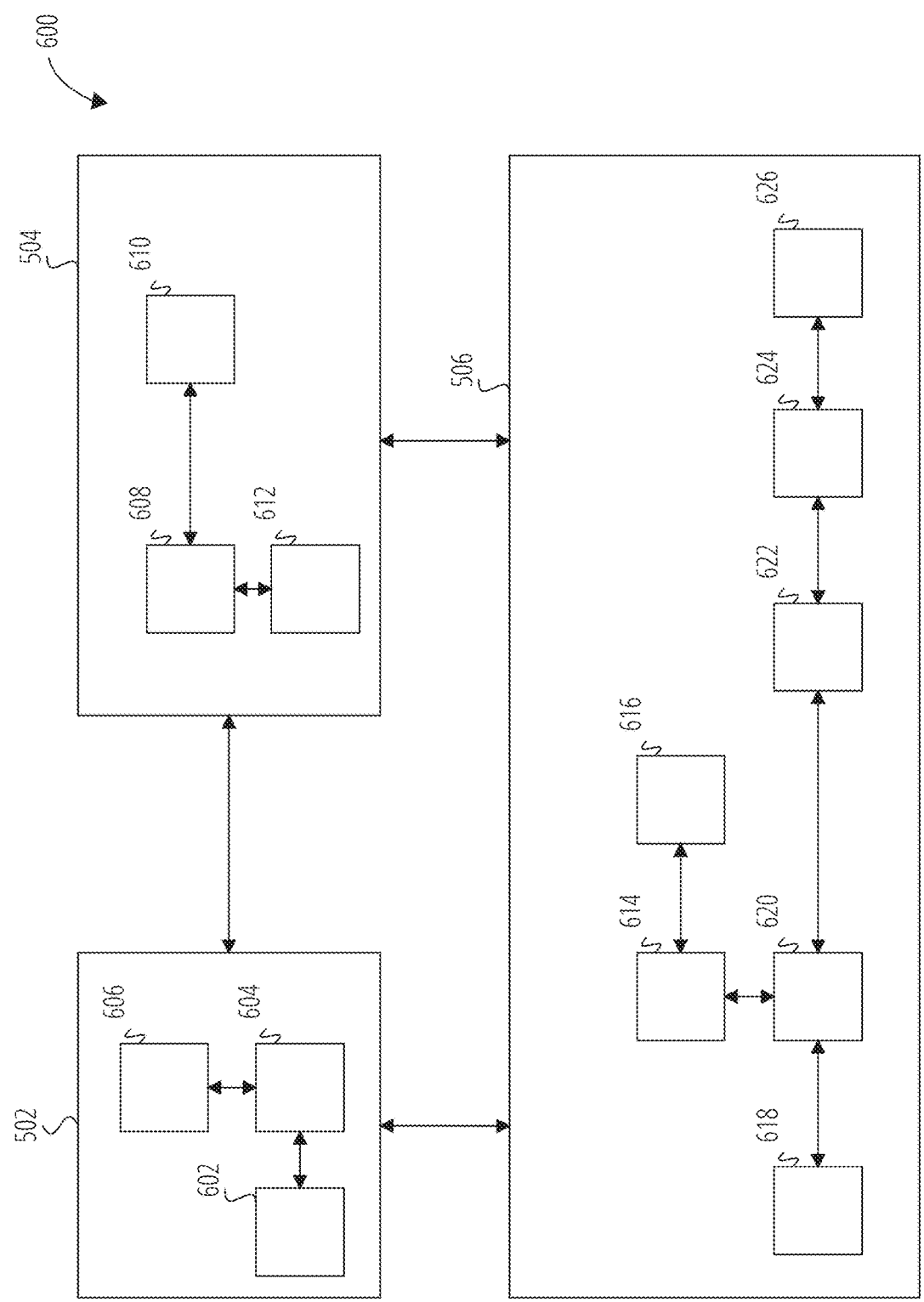
FIG. 6 illustrates an example circuit diagram including a global grid and a local grid for relative placement of components in accordance with some embodiments.

FIG. 6 illustrates an example circuit diagram including a global grid and a local grid for relative placement of components in accordance with some embodiments. As described earlier with regard to FIG. 5, FIG. 6 illustrates an example layout 600 include a global grid for relative placement of the groups of components, as well as the individual components within each group.

Block 502 may include components 602, 604, and 606. Block 504 may include components 608, 610, and 612. Block 502 can be positioned within a specific pitch distance from block 504 to the left. Block 506 includes components 614, 616, 618, 620, 622, 624, and 626. Block 506 is positioned below both blocks 502 and 504.

FIG. 7 illustrates an example method for performing operations of relative placement of components in accordance with some embodiments.

In this example, method 700 begins at operation 702. For a first circuit design stored in memory of a computing system, the computing system retrieves a data structure of a first circuit design stored in memory. The data structure includes a location of each component of a plurality of components within the first circuit design. The data structure can include additional information including a size of the first circuit design, positioning of each component relative to the other components, and sizes of each component. The data structure may include various other information pertaining to the first circuit design as appropriate. In some embodiments, the computing device defines a global grid for the first circuit design. The global grid includes a location of each component of a plurality of components within the first circuit design. The components within the circuit design may include various electronic components varying in size, shape, pins, input/output requirements, voltage/current tolerances, and other various specifications.

At operation 704, the computing device determines a location for each component of the circuit design within the global grid (if the location information is not provided by the data structure). The computing device at operation 704 also determines one or more component characteristics for each component of the first circuit design. As described above, each component may include various characteristics such as, size, shape, power requirements, temperature thresholds, timing requirements, gate pitch, and the like. In performing either or both of operations 702 and 704, a flexible scan line engine can be used to identify each component within the circuit design. The flexible scanline engine can be manually configured based on a scan tolerance, a scan filter, or an accumulation factor. The scan tolerance may be adjusted to scan the layout to identify components within a range of coordinates. The scan filter can be adjusted to identify gridlines (e.g., for global and/or local grids) within a certain tolerance. For example, a device within a certain x or y distance of another device (e.g., within 5 nm) is considered to be on a same grid line. This process ensures that devices with a negligible distance x or y is labeled with the same x or y grid coordinate. Additionally, the scanline engine can be configured to adjust an integer value of device's location if the correspondence between the reference device and the new device has a characteristic different what would affect the number of grid position in the new layout. For example, an accumulation factor (e.g., the integer value of the device's location) provides a way to handle the placement effect of a reference device with a size of N grids corresponding to a new device with a size of M grids.

Operations 706 and 708 may be performed by the computing device in serial or in parallel. The computing device at operations 706 selects two or more components for a first and a second group. Each group includes distinct components based on one or more shared characteristics. For example, group A includes components 1, 2, and 3 that share a component characteristic of X. Group B includes components 4, 5, 6, and 7 and share a component characteristic of Y and Z. It is understood that the methods and systems described herein can be scaled to accommodate any number of groups having any number of shared characteristics.

The computing device at operation 710 instantiates a second circuit design (e.g., a new or updated circuit design) that is to include at least a subset of components of the plurality of components of the first circuit design. The instantiated second circuit design may be a design update of a previous version.

In some embodiments, for each of the first and second groups of components, a first and second respective local grid is defined. The computing device assigns to each component of the first or second groups, an integer corresponding to a distance of the component from an origin of the first or second local grid. The computing device also stores a first and a second grid definition corresponding to a delineation of the first and second local grids. For example, a first group includes four components and a local grid including pitches spaced out at 20 mm each. This information is stored for each group. It is understood that although the example method describes a first and a second group, there may be more or fewer groups depending on the particular layout.

After operation 710, at operation 712, for the instantiated circuit design, the computing device retrieves the data structure. The data structure is retrieved by operation 712 performing subsequent operations with respect to the instantiated circuit design. The data structure may include definitions for the spacing, size, components, and various other requirements or specifications for the second circuit design. In some embodiments, the computing device defines a first global grid for the second circuit design. In some embodiments, the computing device places the components of the first and second groups from lower left to upper right. Operations 714 and 720 may occur in series or in parallel. The computing device at operations 716 and 722 in some embodiments receive and/or determine scaling factors for each group. The received scaling factors may be the same or different for each group. The scaling factors correspond to a pitch used to calculate a pitch placement for each component within the group. In some embodiments, determining the scaling factors for each group includes extracting data from the first circuit design and data from the second circuit design to determine an appropriate scaling factor. For example, the components are to be replicated from a first circuit design to a second circuit design and the second circuit design is to be smaller than the first. The scaling factor for the groups of components will be less than 1 to accommodate the smaller, second circuit design.

Based on the received scaling factor for the specified group, at operations 716 and 722, the computing device scales the group. For example, FIG. 3 includes a first group and receives a first scaling factor of 0.5 and FIG. 4 includes a second group and receives a second scaling factor of 0.8. In some embodiments, the computing device scale and places the group by size. For example, the group in the lower left is placed first, and the group in the upper right is placed last.

In some embodiments, each component of the first group is multiplied by the first scaling factor for the generated second layout. Similarly, each component of the second group is multiplied by the second scaling factor for the generated second layout. Each group is scaled for the requirements of the second circuit design.

After the groups of components are scaled according to their respective scaling factors, each of the first and/or second group is placed in the instantiated circuit design at operations 718 and 724. The first and/or second groups are placed at a location within the instantiated second circuit design corresponding to the location of the first and/or second group within the global grid of the first circuit design. For example, a first circuit design includes a first group at a bottom left corner of the design. The second circuit design will include the first group (scaled as appropriate according to the scaling factor) and placed at a bottom left corner of the design. The placement of the groups in the second design correspond to the placement of the groups from the first design.

In some embodiments, the second global grid is mapped to mirror the first global grid. By doing so, each of the components of the first layout is able to be replicated or placed in the second layout while maintaining the relationships between the components established in the first layout.

Figure 8:
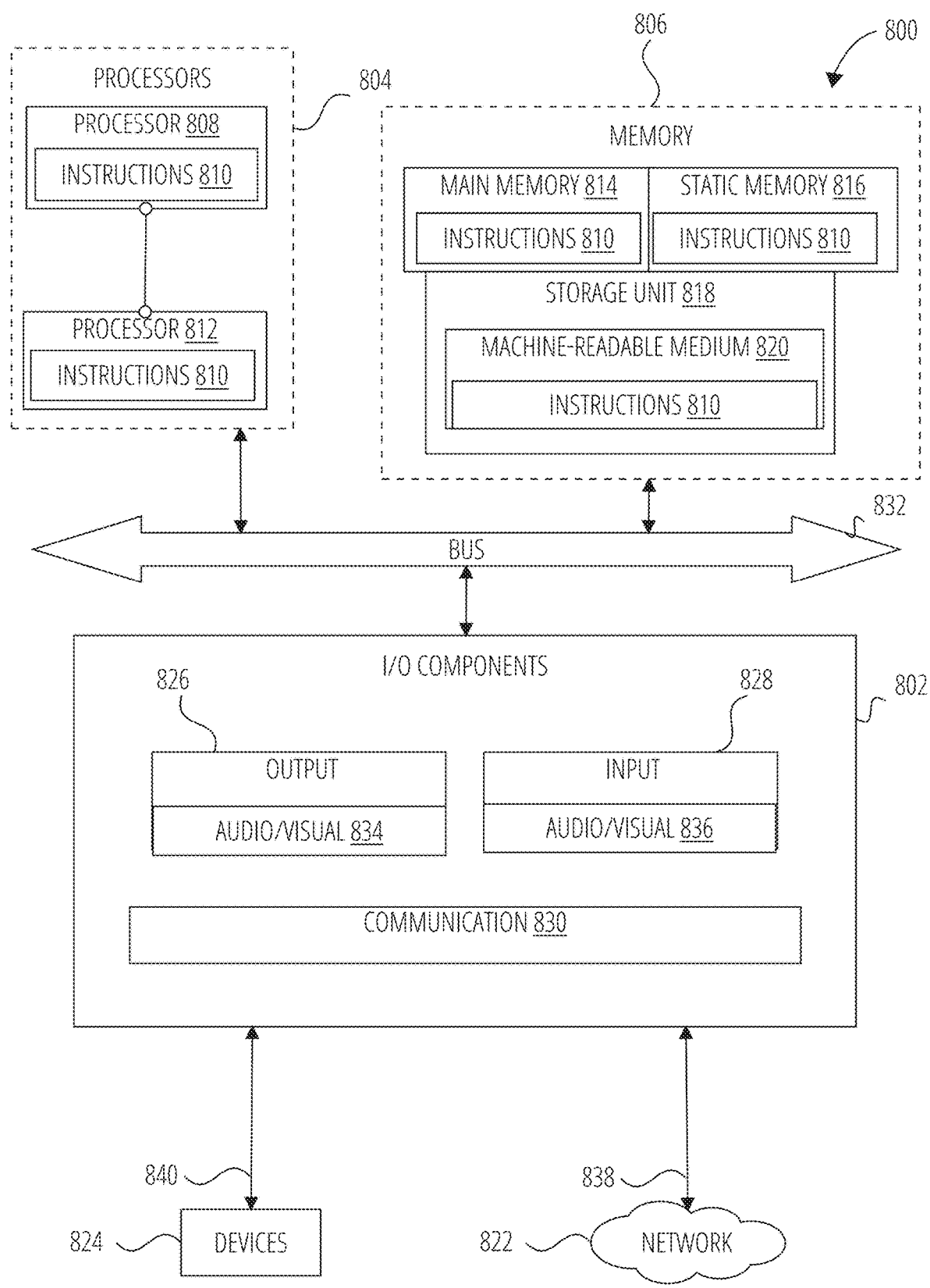
FIG. 8 illustrates a block diagram an example system for implementing relative placement of components by application of layered abstractions in accordance with some embodiments.

FIG. 8 is a block diagram illustrating components of a device 800 according to some embodiments, able to read instructions from a machine-readable medium 820 (e.g., machine-readable storage medium or machine-readable storage device) and perform any one or more of the methodologies discussed herein. The instructions may cause the device 800 to execute the method illustrated in FIG. 7. Additionally, or alternatively, the instructions 810 may implement one or more of the components of FIGS. 1-6. The instructions 810 transform the general, non-programmed device 800 into a particular device 800 programmed to carry out the described and illustrated functions in the manner described. In alternative embodiments, the device 800 operates as a standalone device or may be coupled (e.g., connected) to other machines.

The device 800 may comprise, but not be limited to, a server computer, a client computer, a personal computer (PC), a tablet computer, a laptop computer, a netbook, a PDA, or any machine capable of executing the instructions 810, sequentially or otherwise, that specify actions to be taken by device 800. Further, while only a single device 800 is illustrated, the term "machine" shall also be taken to include a collection of devices 800 that individually or jointly execute the instructions 810 to perform any one or more of the methodologies discussed herein.

The device 800 may include processors 804, memory/storage 806, and I/O components 802, which may be configured to communicate with each other such as via a bus 832. In an example embodiment, the processors processor 808 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, processor 808 and processor 812 that may execute the instructions 810. The term "processor" is intended to include multi-core processor that may comprise two or more independent processors (sometimes referred to as "cores") that may execute instructions 810 contemporaneously. Although FIG. 8 shows multiple processors 804, the device 800 may include a single processor with a single core, a single processor with multiple cores (e.g., a multi-core process), multiple processors with a single core, multiple processors with multiples cores, or any combination thereof.

The memory/storage memory 806 may include a memory 806, such as a main memory 814, or other memory storage, and a storage unit 818, both accessible to the processor 808 such as via the bus 832. The storage unit 818 and memory 806 store the instructions 810 embodying any one or more of the methodologies or functions described herein. The instructions 810 may also reside, completely or partially, within the memory 816, within the storage unit 818, within at least one of the processors 806 (e.g., within the processor's cache memory), or any suitable combination thereof, during execution thereof by the device 800. Accordingly, the memory 814, the storage unit 818, and the memory of processors 804 are examples of machine-readable media.

As used herein, "machine-readable medium" includes a machine-readable storage device able to store instructions 810 and data temporarily or permanently and may include, but is not limited to, random-access memory (RAM), read-only memory (ROM), buffer memory, flash memory, optical media, magnetic media, cache memory, other types of storage (e.g., Erasable Programmable Read-Only Memory (EEPROM)) and/or any suitable combination thereof. The term "machine-readable medium" should be taken to include a single medium or multiple media (e.g., a centralized or distributed database, or associated caches and servers) able to store instructions 810. The term "machine-readable medium" shall also be taken to include any medium, or combination of multiple media, that is capable of storing instructions (e.g., instructions 810) for execution by a device (e.g., device 800), such that the instructions, when executed by one or more processors of the device 800 (e.g., processors 804), cause the device 800 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

The input/output (I/O) components 802 may include a wide variety of components to receive input, provide output, produce output, transmit information, exchange information, capture measurements, and so on. The specific I/O components 802 that are included in a particular machine will depend on the type of machine. For example, portable machines such as mobile phones will likely include a touch input device or other such input mechanisms, while a headless server machine will likely not include such a touch input device. It will be appreciated that the I/O components 802 may include many other components that are not shown in FIG. 8. The I/O components 802 are grouped according to functionality merely for simplifying the following discussion and the grouping is in no way limiting. In various example embodiments, the I/O components 802 may include output components 826 and input components 828. The output components 826 may include visual components (e.g., a display such as a plasma display panel (PDP), a light emitting diode (LED) display, a liquid crystal display (LCD), a projector, or a cathode ray tube (CRT)), audio input components 834 (e.g., speakers), haptic components (e.g., a vibratory motor, resistance mechanisms), other signal generators, and so forth. The input components 828 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components 836 (e.g., a microphone), and the like.

Communication may be implemented using a wide variety of technologies. The I/O components 802 may include communication components 830 operable to couple the device 800 to a network 822 or devices 824 via coupling 838 and coupling 840, respectively. For example, the communication components 830 may include a network interface component or other suitable device to interface with the network 822. In further examples, communication components 830 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 824 may be another machine or any of a wide variety of peripheral devices (e.g., a peripheral device coupled via a USB).

Moreover, the communication components 830 may detect identifiers or include components operable to detect identifiers. For example, the communication components 830 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF416, Ultra Code, UCC RSS-2D bar code, and other optical codes), or acoustic detection components (e.g., microphones to identify tagged audio signals). In addition, a variety of information may be derived via the communication components 830, such as location via Internet Protocol (IP) geo-location, location via Wi-Fi® signal triangulation, location via detecting an NFC beacon signal that may indicate a particular location, and so forth.

The instructions 810 may be transmitted or received over the network 822 using a transmission medium via a network interface device (e.g., a network interface component included in the communication components 830) and utilizing any one of a number of well-known transfer protocols (e.g., hypertext transfer protocol (HTTP)). Similarly, the instructions 810 may be transmitted or received using a transmission medium via the coupling 840 (e.g., a peer-to-peer coupling) to devices 824. The term "transmission medium" shall be taken to include any intangible medium that is capable of storing, encoding, or carrying instructions 810 for execution by the device 800, and includes digital or analog communications signals or other intangible medium to facilitate communication of such software.

Figure 9:
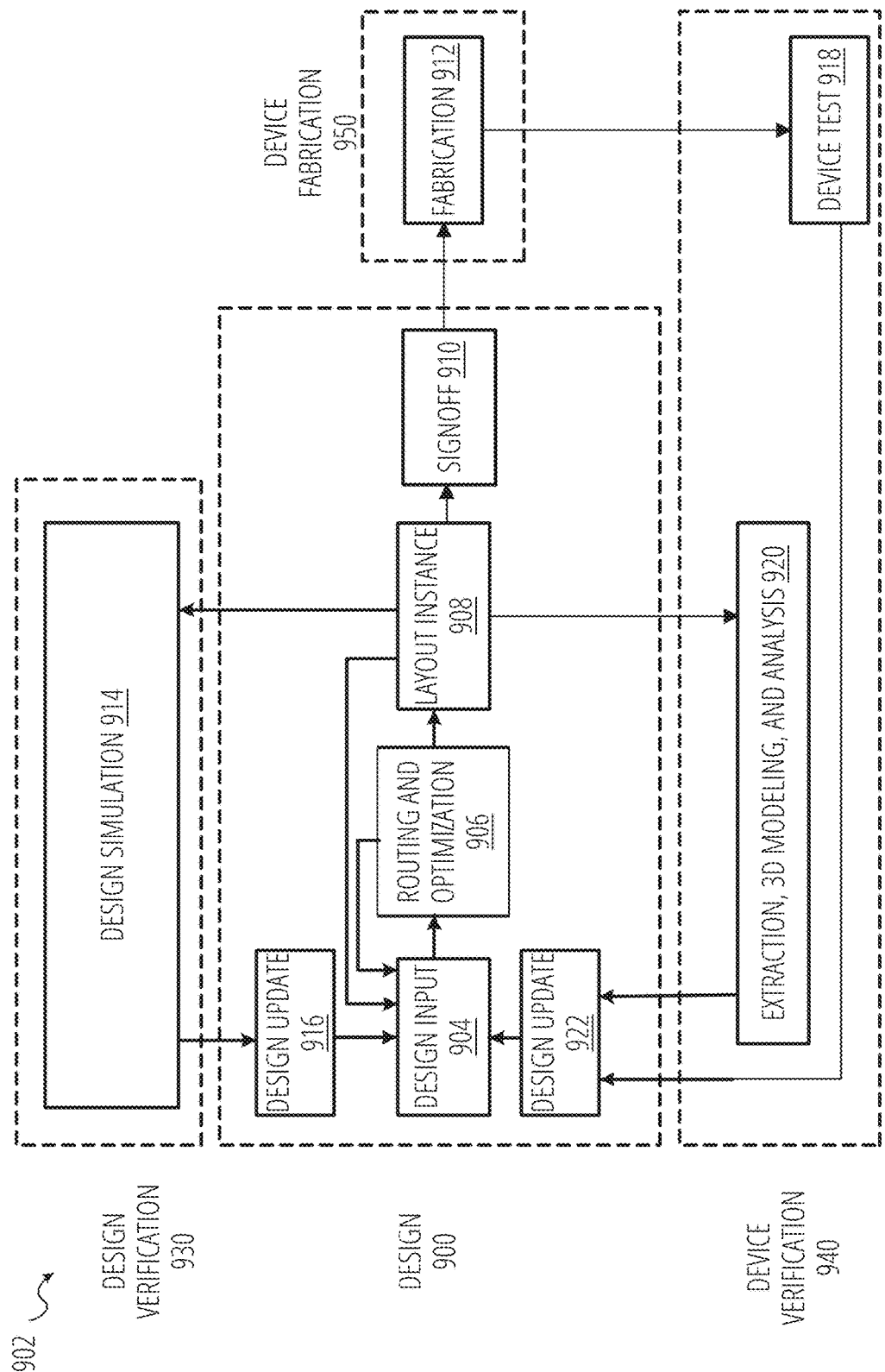
FIG. 9 is a diagram illustrating an example design process flow for generating a layout using techniques of applying relative placement of components by application of layered abstractions in accordance with some embodiments.

FIG. 9 is a diagram illustrating an example design process flow 902, according to some embodiments. As shown, the design process flow 902 includes a design phase 900, a device fabrication phase 950, a design verification phase 930, and a device verification phase 940. The design phase 900 involves an initial design input 904 operation where the basic elements and functionality of a device are determined, as well as revisions based on various analyses and optimization of a circuit design. This design input 904 operation is where block instances are used in the circuit design and any additional circuitry for the design around the blocks is selected. The initial strategy, tactics, and context for the device to be created are also generated in the design input 904 operation, depending on the particular design algorithm to be used.

In some embodiments, following an initial selection of design values in the design input 904 operation, routing, timing analysis, and optimization are performed in a routing and optimization 906 operation, along with any other automated design processes. While the design process flow 902 shows optimization 906 occurring prior to a layout instance 908, routing, timing analysis, and optimization 906 may be performed at any time to verify operation of a circuit design. For instance, in various embodiments, timing analysis in a circuit design may be performed prior to routing of connections in the circuit design, after routing, during register transfer level (RTL) operations, or as part of a signoff 910, as described below.

After design inputs are used in the design input 904 operation to generate a circuit layout, and any of the routing and optimization 906 operations are performed, a layout is generated in the layout instance 908. The layout describes the physical layout dimensions of the device that match the design inputs. Prior to this layout being provided to a fabrication 912 operation, the signoff 910 is performed on the circuit design defined by the layout.

After signoff verification by the signoff 910, a verified version of the layout is used in the fabrication 912 operation to generate a device, or additional testing and design updates may be performed using designer inputs or automated updates based on design simulation 914 operations or extraction, 3D modeling, and analysis 920 operations. Once the device is generated, the device can be tested as part of device test 918 operations, and layout modifications generated based on actual device performance.

A design update 916 from the design simulation 914; a design update 922 from the device test 918 or the extraction, 3D modeling, and analysis 920 operations; or the design input 904 operation may occur after the initial layout instance 908 is generated. In various embodiments, whenever design inputs are used to update or change an aspect of a circuit design, a timing analysis and the routing and optimization 906 operation may be performed.

What is claimed is:

1. A non-transitory computer-readable storage medium storing instructions that, when executed by one or more processors, cause the one or more processors to perform operations comprising:
   retrieving a data structure of a first circuit design stored in memory, the data structure comprising a location of each component of a plurality of components within the first circuit design;
   determining, for each component of the first circuit design, a component characteristic;
   defining a first group of components from the plurality of components, each individual component of the first group having a first shared component characteristic and having an assigned integer that corresponds to a distance of the individual component from a reference component of a first local grid, the first local grid being defined for the first group and encompassing the first group of components;
   instantiating a second circuit design comprising at least a subset of components of the plurality of components of the first circuit design;
   calculating a first scaling factor for the second circuit design for the components of the first group;
   scaling the first group based on the first scaling factor; and
   placing the first group at a location in the second circuit design that corresponds to the location of the first group within the first circuit design.

2. The storage medium of claim 1, wherein the operations comprise:
   scanning, by a flexible scan line engine, the first circuit design to identify each component within the first circuit design;
   defining a global grid of the first circuit design having a plurality of rows and a plurality of columns; and
   assigning, to each identified component, a row and a column on the global grid of the first circuit design.

3. The storage medium of claim 1, wherein the operations comprise:
   defining, for a second group of components from the plurality of components, each individual component of the second group having a second shared component characteristic and having an assigned integer that corresponds to a distance of the individual component from a reference component of a second local grid, the second local grid being defined for the second group and encompassing the second group of components, the second shared component characteristic of the second group being distinct from the shared component characteristic of the first group.

4. The storage medium of claim 3, wherein instantiating the second circuit design comprises:
   calculating, using the data structure, a second scaling factor for the second circuit design for the components of the second group;
   scaling the second group based on the second scaling factor; and
   placing the second group at a second location in the second circuit design corresponding to the location of the second group within the first circuit design.

5. The storage medium of claim 3, wherein the operations comprise:
   defining the second group of components comprises:
      defining a second local grid to encompass the second group of the components;
      assigning, to each component of the second group of components, an integer corresponding to a distance of the component from a reference component of the second local grid, and
      storing, in the data structure, a second grid definition corresponding to a delineation of the second local grid.

6. The storage medium of claim 5, wherein scaling the first group based on the first scaling factor for the components of the first group comprises:
   multiplying, for each individual component of the first group, the first scaling factor with the integer corresponding to the individual component to determine a location within the second circuit design for placement of the individual component.

7. The storage medium of claim 5, wherein the operations comprising:
   receiving a second scaling factor for the second group, the scaling of the second group based on the second scaling factor for the components of the second group comprises:
   multiplying, for each component of the second group, the second scaling factor with the integer corresponding to the component to determine a location within the second circuit design for placement of the component.

8. The storage medium of claim 1, wherein the defining of the first group of components comprises:
   defining the first local grid to encompass the first group of the components;

assigning, to each component of the first group of components, an integer corresponding to a distance of the component from the reference component of the first local grid; and storing, in the data structure, a first grid definition corresponding to a delineation of the first local grid.

9. The storage medium of claim 1, wherein the component characteristic comprises one or more of a gate pitch, a design objective, a component type, and a component size.

10. A system comprising:
one or more processors of a machine; and
a computer storage medium storing instructions, which, when executed by the machine, cause the machine to perform operations comprising:
retrieving a data structure of a first circuit design stored in memory, the data structure comprising a location of each component of a plurality of components within the first circuit design;
determining, for each component of the first circuit design, a component characteristic;
defining, for a first group of components from the plurality of components, each individual component of the first group having a first shared component characteristic and having an assigned integer that corresponds to a distance of the individual component from a reference component of a first local grid, the first local grid being defined for the first group and encompassing the first group of components;
instantiating a second circuit design comprising at least a subset of components of the plurality of components of the first circuit design;
calculating a first scaling factor for the second circuit design for the components of the first group;
scaling the first group based on the first scaling factor; and
placing the first group at a location in the second circuit design that corresponds to the location of the first group within the first circuit design.

11. The system of claim 10, wherein the operations comprise:
scanning, by a flexible scan line engine, the first circuit design to identify each component within the first circuit design;
defining a global grid of the first circuit design having a plurality of rows and a plurality of columns; and
assigning, to each identified component, a row and a column on the global grid of the first circuit design.

12. The system of claim 10, wherein the operations comprise:
defining, for a second group of components from the plurality of components, each individual component of the second group having a second shared component characteristic and a second global location on a first global grid and having an assigned integer that corresponds to a distance of the individual component from a reference component of a second local grid, the second local grid being defined for the second group and encompassing the second group of components, the second shared component characteristic of the second group being distinct from the shared component characteristic of the first group.

13. The system of claim 12, wherein instantiating the second circuit design comprises:
calculating, using the data structure, a second scaling factor for the second circuit design for the components of the second group;

scaling the second group based on the second scaling factor for the components of the second group; and
placing the second group at a second location in the second circuit design corresponding to the location of the second group within the first circuit design.

14. The system of claim 13, wherein the defining of the first group of components comprises:
defining the first local grid to encompass the first group of the components;
assigning, to each component of the first group of components, an integer corresponding to a distance of the component from the reference component of the first local grid; and
storing, in the data structure, a first grid definition corresponding to a delineation of the first local grid.

15. The system of claim 12, wherein the operations comprise:
defining the second group of components comprises:
defining a second local grid to encompass the second group of the components;
assigning, to each component of the second group of components, an integer corresponding to a distance of the component from a reference component of the second local grid; and
storing, in the data structure, a second grid definition corresponding to a delineation of the second local grid.

16. The system of claim 15, wherein the operations comprising:
receiving a second scaling factor for the second group, wherein scaling the second group based on the second scaling factor for the components of the second group comprises:
multiplying, for each component of the second group, the scaling factor with the integer corresponding to the component to determine a location within the second circuit design for placement of the component.

17. The system of claim 10, wherein scaling the first group based on the first scaling factor for the components of the first group comprises:
multiplying, for each individual component of the first group, the first scaling factor with an integer corresponding to the individual component to determine the location within the second circuit design for placement of the individual component.

18. The system of claim 10, wherein the component characteristic comprises one or more of a gate pitch, a design objective, a component type, and a component size.

19. A method, comprising:
retrieving a data structure of a first circuit design stored in memory, the data structure comprising a location of each component of a plurality of components within the first circuit design;
determining, for each component of the first circuit design, a component characteristic;
defining a first group of components from the plurality of components, each individual component of the first group having a first shared component characteristic and having an assigned integer that corresponds to a distance of the individual component from a reference component of a first local grid for the first group, the first local grid being defined for the first group and encompassing the first group of components;
instantiating a second circuit design comprising at least a subset of components of the plurality of components of the first circuit design;

calculating a first scaling factor for the second circuit design for the components of the first group;

scaling the first group based on the first scaling factor; and placing the first group at a location in the second circuit design that corresponds to a first global location of the first group within the first circuit design.

20. The method of claim 19, wherein the defining of the first group of components comprising:

defining the first local grid to encompass the first group of the components;

assigning, to each component of the first group, an integer corresponding to a distance of the component from the reference component of the first local grid;

storing, a first grid definition corresponding to a delineation of the first local grid; and multiplying, for each component of the first group, the first scaling factor with the integer corresponding to the component to determine a location within the second circuit design for placement of the component.

\* \* \* \* \*